(12) United States Patent
Yamada et al.

(10) Patent No.: US 11,664,191 B2
(45) Date of Patent: May 30, 2023

(54) ELECTRON BEAM IRRADIATION APPARATUS AND ELECTRON BEAM IRRADIATION METHOD

(71) Applicant: NuFlare Technology, Inc., Yokohama (JP)

(72) Inventors: Taku Yamada, Ayase (JP); Kota Iwasaki, Atsugi (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/643,727

(22) Filed: Dec. 10, 2021

(65) Prior Publication Data
US 2022/0189734 A1 Jun. 16, 2022

(30) Foreign Application Priority Data
Dec. 15, 2020 (JP) .............................. JP2020-207701

(51) Int. Cl.
*H01J 37/30* (2006.01)
*H01J 37/04* (2006.01)

(52) U.S. Cl.
CPC ........ *H01J 37/3007* (2013.01); *H01J 37/045* (2013.01); *H01J 2237/0435* (2013.01)

(58) Field of Classification Search
CPC .. H01J 37/06; H01J 37/20; H01J 37/24; H01J 37/26; H01J 37/073; H01J 37/045;
(Continued)

(56) References Cited

U.S. PATENT DOCUMENTS

2009/0200495 A1* 8/2009 Platzgummer ........ B82Y 40/00
250/492.22
2019/0287759 A1 9/2019 Own et al.
(Continued)

FOREIGN PATENT DOCUMENTS

JP 2003-511855 A 3/2003
JP 2022-35477 A 3/2022
(Continued)

OTHER PUBLICATIONS

Combined Taiwanese Office Action and Search Report dated Nov. 30, 2022 in Patent Application No. 110142359 (with English machine translation), 12 pages.

*Primary Examiner* — David E Smith
*Assistant Examiner* — Hsien C Tsai
(74) *Attorney, Agent, or Firm* — Oblon, McClelland, Maier & Neustadt, L.L.P.

(57) ABSTRACT

According to one aspect of the present invention, an electron beam irradiation apparatus includes a photoelectric surface configured to receive irradiation of excitation light on a side of a front surface, and generate electron beams from a side of a back surface; a blanking aperture array mechanism provided with passage holes corresponding to the electron beams and configured to perform deflection control on each of the plurality of electron beams passing through the passage holes; and an adjustment mechanism configured to adjust at least one of an orbit of transmitted light that passes through at least one of arrangement objects including the photoelectric surface, the blanking aperture array mechanism, and the limit aperture substrate up to the stage and reaches the stage, among an irradiated excitation light, and an orbit of the electron beams, wherein the arrangement objects shield at least a part of the transmitted light.

11 Claims, 17 Drawing Sheets

(58) Field of Classification Search
CPC .............. H01J 37/3177; H01J 37/3007; H01J 37/1477; H01J 37/222; H01J 37/244; H01J 37/147; H01J 37/28; H01J 2237/049; H01J 2237/151; H01J 2237/0435; H01J 2237/06333; H01J 2237/31779

See application file for complete search history.

(56) References Cited

U.S. PATENT DOCUMENTS

| | | | |
|---|---|---|---|
| 2020/0328060 A1* | 10/2020 | Iizuka | H01J 37/1471 |
| 2022/0059310 A1 | 2/2022 | Iwasaki et al. | |

FOREIGN PATENT DOCUMENTS

| | | |
|---|---|---|
| TW | 202038284 A | 10/2020 |
| WO | WO 01/26134 A1 | 4/2001 |

* cited by examiner

ELECTRON BEAM IRRADIATION APPARATUS AND ELECTRON BEAM IRRADIATION METHOD

CROSS-REFERENCE TO RELATED APPLICATION

This application is based upon and claims the benefit of priority from prior Japanese Patent Application No. 2020-207701 filed on Dec. 15, 2020 in Japan, the entire contents of which are incorporated herein by reference.

BACKGROUND OF THE INVENTION

Field of the Invention

One aspect of the present invention relates to an electron beam irradiation apparatus and an electron beam irradiation method. For example, the present invention relates to a multi-electron beam writing apparatus and a multi-electron beam writing method.

Related Art

Lithography technology contributing to the progress of miniaturization of semiconductor devices, is a very important, and the only process to generate a pattern among semiconductor manufacturing processes. Recently, with the high integration of LSI, a circuit line width required for the semiconductor devices becomes finer year by year. Here, electron beam writing technology inherently has excellent resolution and a mask pattern is written on mask blanks using an electron beam.

For example, there is a writing apparatus using multiple beams. As compared with a case of performing writing with one electron beam, irradiation of more beams can be performed at one time by using the multiple beams, so that the throughput can be greatly improved. In such a multi-beam writing apparatus, for example, electron beams emitted from an electron gun assembly are passed through a mask having a plurality of holes to form multiple beams, each beam blanking-controlled and not shielded by a limit aperture is reduced by an optical system, a mask image is reduced, each beam is deflected by a deflector, and a desired position on a target object is irradiated with each beam.

As an electron beam source, technology for forming an electron beam by receiving irradiation of a laser light on a front surface of a photoelectric surface and emitting electrons from a back surface has been examined (see JP-A-2003-511855, for example). The film thickness of the photoelectric surface used in the technology is very small, and emitted laser light passes through the photoelectric surface. For this reason, there is a problem that transmitted light reaches the target object separately from the electron beam, and a resist on the target object is exposed to light. If the resist on the target object is exposed to light, this affects writing accuracy.

BRIEF SUMMARY OF THE INVENTION

According to one aspect of the present invention, an electron beam irradiation apparatus includes:
a photoelectric surface configured to receive irradiation of excitation light on a side of a front surface, and generate a plurality of electron beams from a side of a back surface;
a blanking aperture array mechanism provided with passage holes corresponding to the plurality of electron beams and configured to perform deflection control on each of the plurality of electron beams passing through the passage holes;
a limit aperture substrate provided with an opening and configured to limit passage of the plurality of electron beams;
a stage on which a target object irradiated with the plurality of electron beams having passed through the blanking aperture array mechanism and the limit aperture substrate can be mounted; and
an adjustment mechanism configured to adjust at least one of an orbit of transmitted light that passes through at least one of arrangement objects including the photoelectric surface, the blanking aperture array mechanism, and the limit aperture substrate up to the stage and reaches the stage, among an irradiated excitation light, and an orbit of the plurality of electron beams, wherein
the arrangement objects shield at least a part of the transmitted light.

According to another aspect of the present invention, an electron beam irradiation method includes:
receiving irradiation of excitation light on a side of a front surface of a photoelectric surface and emitting a plurality of electron beams from a side of a back surface of the photoelectric surface;
adjusting at least one of an orbit of transmitted light of the irradiated excitation light that passes through at least one of arrangement objects including the photoelectric surface, a blanking aperture array mechanism performing deflection control on each of the plurality of electron beams, and a limit aperture substrate provided with an opening and limiting passage of the plurality of electron beams and reaches a stage on which a target object is mounted, and an orbit of the plurality of electron beams;
shielding at least a part of the transmitted light by the arrangement objects; and
irradiating the target object with the plurality of electron beams.

DETAILED DESCRIPTION OF THE INVENTION

In the following embodiments, an apparatus and a method capable of reducing the arrival of transmitted light to a target object surface in irradiation of an electron beam will be described.

Further, in the following embodiments, a case of irradiating with multiple photoelectron beams in the embodiment will be described. However, the electron beam is not limited to multiple beams, and may be a single beam. Further, a writing apparatus will be described below as an example of an electron beam irradiation apparatus.

First Embodiment

Figure 1:
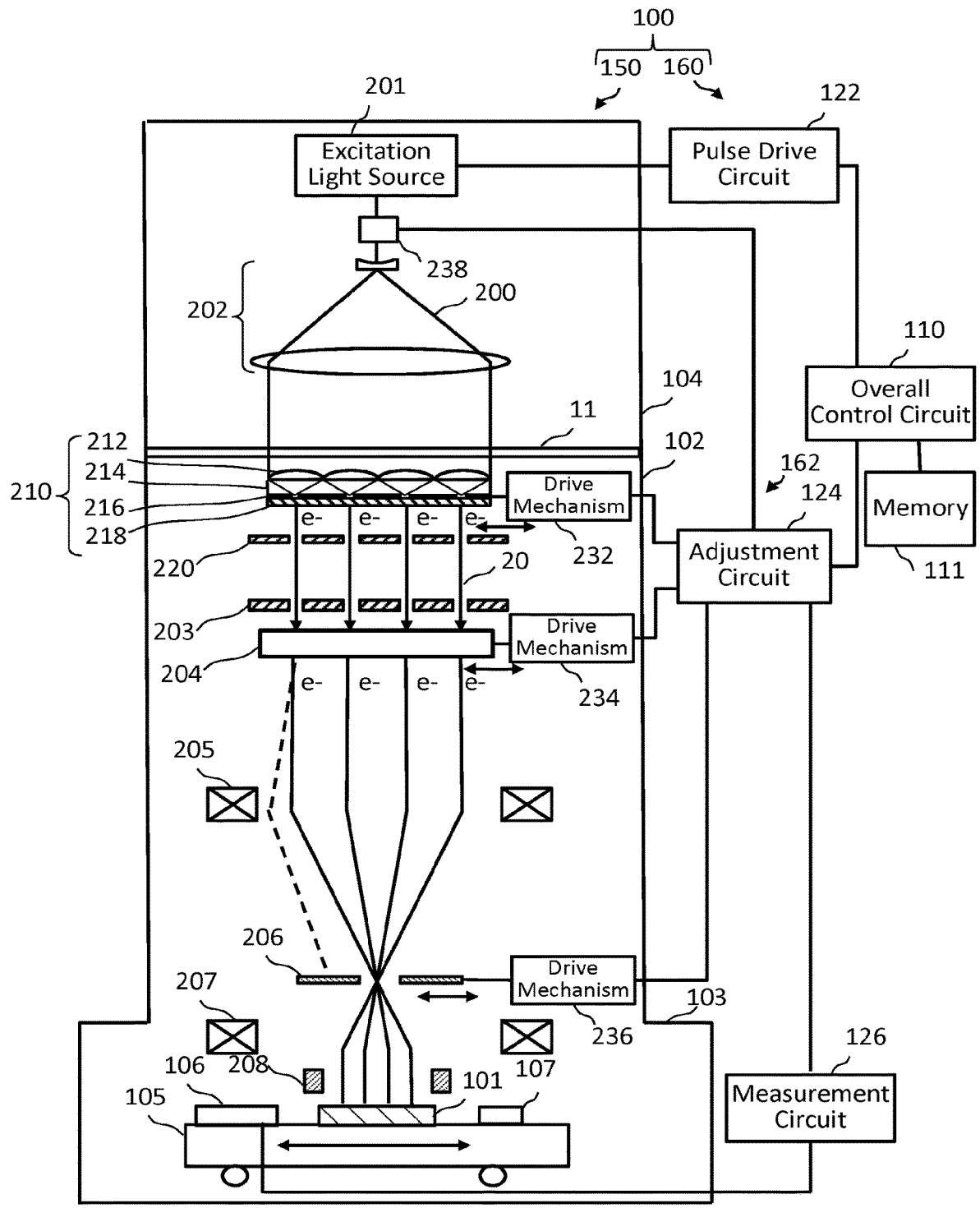
FIG. 1 is a conceptual diagram showing a configuration of a writing apparatus in a first embodiment.

FIG. 1 is a conceptual diagram showing a configuration of a writing apparatus in a first embodiment. In FIG. 1, a writing apparatus 100 includes a writing mechanism 150 and a control circuit 160. The writing apparatus 100 is an example of a multi-electron beam writing apparatus. In the writing mechanism 150, a laser light source 201 to be an excitation light source, a laser light adjustment mechanism 238, and an illumination optical system 202 such as a beam expander are disposed in a lens barrel 104. The excitation light source may be not only a laser light source but also an appropriate light source such as an LED or a lamp. Further, in the writing mechanism 150, a photoelectron emission mechanism 210, a multi-anode electrode 220, a shaping aperture array substrate 203, a blanking aperture array mechanism 204, an electromagnetic lens 205, a first limit aperture substrate 206, an electromagnetic lens 207 (objective lens), and an objective deflector 208 are disposed in this order in the lens barrel 102 (multi-electron beam column) in which the lens barrel 104 and a space are shielded so that light can be transmitted by a partition window 11 and vacuum is held. Further, a plurality of drive mechanisms (drive circuits) 232, 234, and 236 are disposed in the lens barrel 102.

The drive mechanism 232 (photoelectric surface drive mechanism) moves the photoelectron emission mechanism 210 in a direction orthogonal to an orbit central axis of the electron beam. Further, the drive mechanism 234 (deflector drive mechanism) moves the blanking aperture array mechanism 204 (an example of a deflector) in a direction orthogonal to the orbit central axis of the electron beam. Further, the drive mechanism 236 (aperture drive mechanism) moves the first limit aperture substrate 206 in a direction orthogonal to the orbit central axis of the electron beam.

Further, in the writing mechanism 150, the XY stage 105 is disposed in a writing chamber 103 disposed below the lens barrel 102. A target object 101 such as a mask blank coated with a resist to be a writing target substrate at the time of writing is disposed on the XY stage 105. An exposure mask when a semiconductor device is manufactured or a semiconductor substrate (silicon wafer) where the semiconductor device is manufactured is included in the target object 101. Further, the inside of the lens barrel 102 and the inside of the writing chamber 103 are evacuated by a vacuum pump not shown in the drawings and controlled to a pressure lower than the atmospheric pressure. Further, the inside of the lens barrel 104 is controlled to the atmospheric pressure. A light intensity measuring device 106 for measuring light intensity is disposed on the XY stage 105. For example, a photodiode is preferably used as the light intensity measuring device 106. Further, a Faraday cup 107 for measuring a current amount of the electron beam is disposed on the XY stage 105. Therefore, the first limit aperture substrate 206 is disposed between the blanking aperture array mechanism 204 and the XY stage 105.

In the photoelectron emission mechanism 210, a multi-lens array 212 is disposed on a glass substrate 214, and a multi-light shielding film 216 to be a light shielding mask and a photoelectric surface 218 (an example of a photoelectron emitter) are disposed on the side of a back surface of the glass substrate 214. A beam expander to be an example of the illumination optical system 202 is configured by a combination of a concave lens and a convex lens. Components of the illumination optical system 202 are not limited to the beam expander, and other lenses and/or mirrors may be included.

The control circuit 160 includes an overall control circuit 110 for controlling the entire writing apparatus, a memory 111, a pulse drive circuit 112, an adjustment circuit 124, and a measurement circuit 126. The overall control circuit 110, the memory 111, the pulse drive circuit 112, and the adjustment circuit 124 are connected to each other by a bus not shown in the drawings. The measurement circuit 126 is connected to the adjustment circuit 124.

The drive mechanisms 232, 234, and 236 and/or the laser light adjustment mechanism 238, and the adjustment circuit 124 form an adjustment mechanism 162. The adjustment mechanism 162 adjusts the intensity on the basis of the intensity of transmitted light that passes through an arrangement object such as the photoelectron emission mechanism 210 and reaches the XY stage 105, among the laser light measured by the light intensity measuring device 106. Therefore, the adjustment mechanism 162 adjusts at least one of an orbit of the transmitted light that passes through at least one of the arrangement objects including the photoelectron emission mechanism 210 including the photoelectric surface 218, the blanking aperture array mechanism 204, and the first limit aperture substrate 206 up to the XY stage 105, and reaches the XY stage 105, among the emitted excitation light, and an orbit of the plurality of electron beams. The arrangement objects shield at least a part of the transmitted light.

Here, in FIG. 1, the configuration necessary for explaining the first embodiment is described. The writing apparatus 100 may generally include other necessary configuration.

Next, an operation of the writing mechanism 150 will be described. Under the control of the overall control circuit 110 that controls the entire writing apparatus 100, the pulse drive circuit 112 drives the laser light source 201. The laser light source 201 generates laser light 200 (excitation light) having a predetermined beam diameter. The laser light 200 includes a pulse wave. The laser light source 201 generates ultraviolet light as the laser light 200. For example, it is preferable to use ultraviolet light having a wavelength of about 260 to 280 nm, for example, ultraviolet light having a wavelength of 266 nm.

The laser light 200 generated from the laser light source 201 is expanded by a beam expander included in the illumination optical system 202, passes through the partition window 11, and illuminates the multi-lens array 212. The multi-lens array 212 divides the laser light 200 into a plurality of lights. The multi-lens array 212 includes a lens array in which individual lenses of the number equal to or more than the number of multi-electron beams 20 is disposed in an array. For example, the multi-lens array 212 includes 512×512 lenses. The multi-lens array 212 condenses the plurality of divided lights, and adjusts a focal position of each light to a height position of a front surface of the photoelectric surface 218. By condensing the light by the multi-lens array 212, the effective luminance of each light can be increased.

In the multi-light shielding film 216, a plurality of openings are formed such that a region of an irradiation spot of each of the plurality of divided and condensed lights (multi-lights) is exposed. As a result, light that has not been condensed by the multi-lens array 212 and has passed through the glass substrate 214 and/or scattered light can be shielded by portions other than the openings. As the multi-light shielding film 216, for example, a chromium (Cr) film is preferably used.

Each light that has passed through the multi-light shielding film 216 is incident on the front surface of the photoelectric surface 218. The photoelectric surface 218 receives a plurality of lights from the front surface and emits multiple photoelectron beams 20 from the back surface. For example, 512×512 photoelectron beams arrayed in the x and y directions are emitted. Specifically, the photoelectric surface 218 receives a plurality of lights from the front surface and emits photoelectrons from respective positions of the back surface corresponding to incidence positions. The photoelectric surface 218 is preferably formed of, for example, a film using a platinum (Pt) as a main material. Furthermore, for example, carbon (C)-based material is preferably coated on the back surface side (downstream side in FIG. 1) of the Pt main film. When the front surface of the photoelectric surface 218 is irradiated with photons having energy larger than a work function of the material of the photoelectric surface 218, the photoelectric surface 218 emits photoelectrons from the back surface. In order to obtain the multiple photoelectron beams 20 having a sufficient current density used in the writing apparatus 100, for example, light of about 0.1 to 100 W/cm$^2$ (about $10^3$ to $10^6$ W/m$^2$) is preferably incident on the front surface of the photoelectric surface 218.

The multiple photoelectron beams 20 emitted from the photoelectric surface 218 are accelerated by being extracted by the multi-anode electrode 220 to which a relatively positive potential has been applied, and travel toward the shaping aperture array substrate 203.

Figure 2:
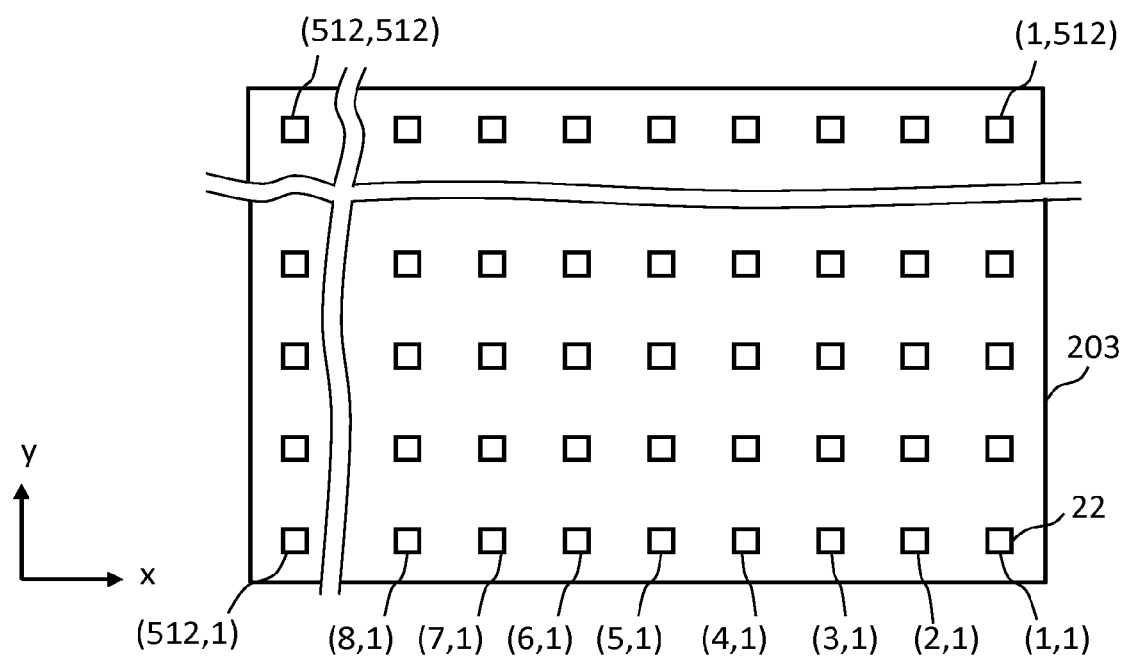
FIG. 2 is a conceptual diagram showing a configuration of a shaping aperture array substrate in the first embodiment.

FIG. 2 is a conceptual diagram showing a configuration of the shaping aperture array substrate in the first embodiment. In FIG. 2, in the shaping aperture array substrate 203, p×q (p, q≥2) holes (openings) 22 are formed in a matrix at a predetermined arrangement pitch in the x and y directions. In FIG. 2, for example, 512×512 holes 22 are formed in the x and y directions. The plurality of holes 22 are formed to be matched with the orbit of the multiple photoelectron beams 20 emitted from the photoelectric surface 218. Each photoelectron beam emitted from the photoelectric surface 218 is not emitted in a uniform shape and size. For example, each photoelectron beam spreads in a divergence direction. Therefore, the shape and the size of each photoelectron beam are formed by the shaping aperture array substrate 203. In FIG. 2, each hole 22 is formed of a rectangle having the same dimension and shape. Alternatively, each hole 22 may have a shape of a circle with the same diameter. The shaping aperture array substrate 203 forms the multiple photoelectron beams 20 used for writing. Specifically, a part of the multiple photoelectron beams emitted through the plurality of holes 22 passes through each hole, so that the multiple photoelectron beams 20 are formed in a desired shape and size.

Figure 3:
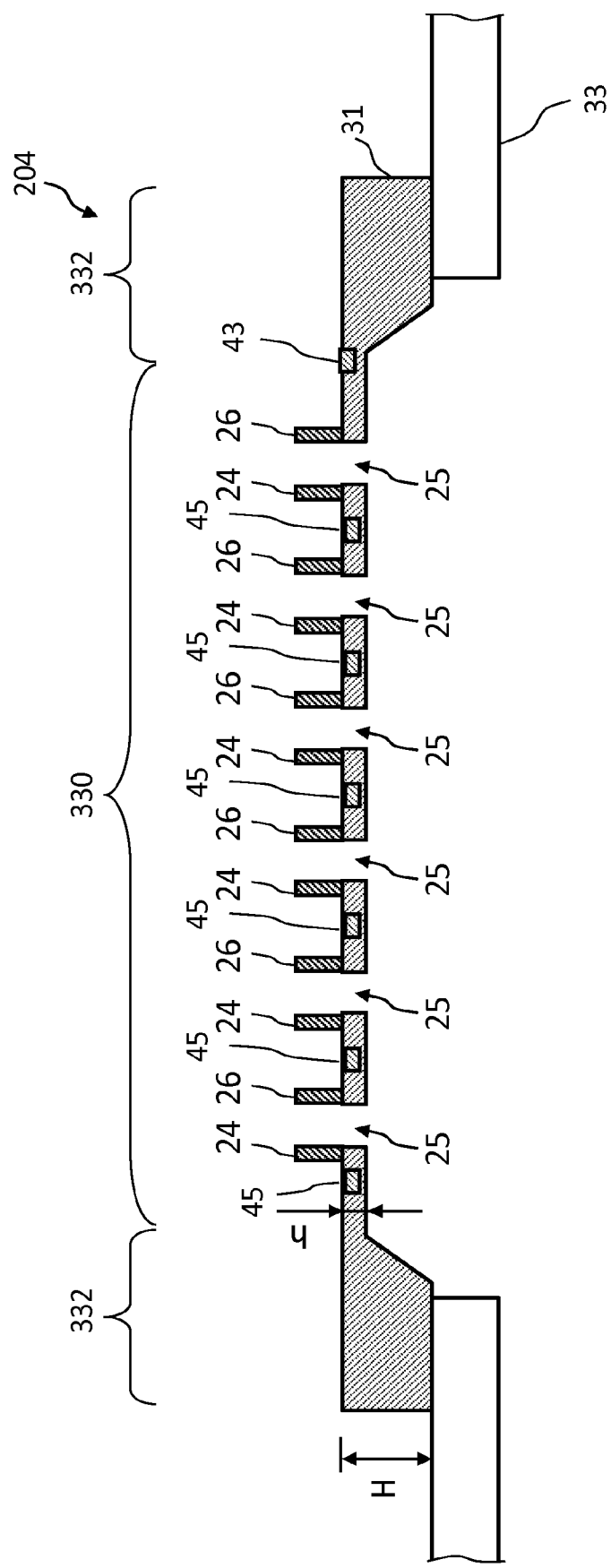
FIG. 3 is a cross-sectional view showing a configuration of a blanking aperture array mechanism in the first embodiment.

FIG. 3 is a cross-sectional view showing a configuration of the blanking aperture array mechanism in the first embodiment. In the blanking aperture array mechanism 204, as shown in FIG. 3, a semiconductor substrate 31 made of silicon or the like is disposed on a support base 33. A center portion of the substrate 31 is thinly scraped from the back surface side, for example, and is processed into a membrane region 330 (first region) with a small film thickness h. A surrounding region of the membrane region 330 becomes an outer circumferential region 332 (second region) with a large film thickness H. A top surface of the membrane region 330 and a top surface of the outer circumferential region 332 are formed to be at the same height position or substantially at the height position. The substrate 31 is held on the support base 33 on a back surface of the outer circumferential region 332. A center portion of the support base 33 is opened and the membrane region 330 is located in an opened region of the support base 33.

In the membrane region 330, a passage hole 25 (opening) for passing each beam of the multiple photoelectron beams 20 is opened at a position corresponding to each hole 22 of the shaping aperture array substrate 203 shown in FIG. 2. In other words, in the membrane region 330 of the substrate 31, a plurality of passage holes 25 through which the corresponding beams of the multiple photoelectron beams 20 using electron beams pass are formed in an array. In addition, a plurality of electrode pairs each having two electrodes at positions facing each other with the corresponding passage hole 25 therebetween among the plurality of passage holes 25 are disposed on the membrane region 330 of the substrate 31. Specifically, as shown in FIG. 3, a set (blanker: blanking deflector) of a control electrode 24 and a counter electrode 26 for blanking deflection provided at positions in the vicinity of each passage hole 25 with each passage hole 25 therebetween is disposed on the membrane region 330. Further, a control circuit 45 (logic circuit) for applying a deflection voltage to the control electrode 24 for each passage hole 25 is disposed in the substrate 31 and in the vicinity of each passage hole 25 on the membrane region 330. The counter electrode 26 for each beam is connected to a ground.

Further, n-bit (for example, 10-bit) parallel wiring lines for control signals are connected to each control circuit 45. In addition to the n-bit parallel wiring lines for the control signals, a clock signal line, a read signal, a shot signal, and a power supply wiring line are connected to each control circuit 45. An individual blanking control mechanism is configured by the control electrode 24, the counter electrode 26, and the control circuit 45, for each of the beams configuring the multiple beams. Further, the plurality of control circuits 45 formed in an array in the membrane region 330 are grouped by the same row or the same column, for example, and the control circuits 45 in the group are connected in series. In addition, a signal from a pad 43 disposed for each group is transmitted to the control circuits 45 in the group. Specifically, a shift register not shown in the drawings is disposed in each control circuit 45. For example, shift registers in the control circuits 45 of the beams in the same row among the p×q multiple beams are connected in series. In addition, for example, control signals of the beams in the same row among the p×q multiple beams are transmitted in series, and the control signals of the respective beams are stored in the corresponding control circuits 45 by p clock signals.

An amplifier (an example of a switching circuit) not shown in the drawings is disposed in the control circuit 45. The amplifier is connected to a positive potential (Vdd: blanking potential: first potential) (for example, 5 V) (first potential) and a ground potential (GND: second potential). An output line (OUT) of the amplifier is connected to the control electrode 24. On the other hand, the ground potential is applied to the counter electrode 26. In addition, the plurality of control electrodes 24 to which the blanking potential and the ground potential are switchably applied are disposed on the substrate 31 at positions facing the respectively corresponding counter electrodes 26 of the plurality of counter electrodes 26 with respectively corresponding passage holes 25 of the plurality of passage holes 25 therebetween.

In a state where the L potential is applied to the input (IN) of the amplifier, control is performed such that the output (OUT) of the amplifier becomes a positive potential (Vdd), and the corresponding beam is deflected by an electric field due to a potential difference with the ground potential of the counter electrode 26, is shielded by the first limit aperture substrate 206, and becomes beam OFF. On the other hand, in a state (active state) where the H potential is applied to the input (IN) of the amplifier, control is performed such that the output (OUT) of the amplifier becomes a ground potential, the potential difference with the ground potential of the counter electrode 26 disappears, and the corresponding beam is not deflected, passes through the first limit aperture substrate 206, and becomes beam ON.

The blanking aperture array mechanism 204 (an example of a deflector) deflects each beam of the multiple photoelectron beams 20 passing through the corresponding passage hole 25 to perform individual blanking control of individually switching beam ON/OFF of each beam. Specifically, the photoelectron beam 20 passing through each passage hole is deflected by voltages applied to the two control electrode 24 and the counter electrode 26 which are independently paired. By such deflection, blanking control is performed. Specifically, the set of the control electrode 24 and the counter electrode 26 individually performs blanking deflection on each corresponding beam of the multiple photoelectron beams 20 by the potential switched by the amplifier to be the corresponding switching circuit. As such, a plurality of blankers perform the blanking deflection of each corresponding beam among the multiple photoelectron beams 20 having passed through the plurality of holes 22 (openings) of the shaping aperture array substrate 203.

The multiple photoelectron beams 20 having passed through the blanking aperture array mechanism 204 are reduced by the electromagnetic lens 205 and travels toward a center hole (opening) formed in the first limit aperture substrate 206 disposed in the vicinity of a crossover position. Here, among the multiple photoelectron beams 20, the electron beam deflected by the blanker of the blanking aperture array mechanism 204 deviates from the position of the center hole of the first limit aperture substrate 206, and is shielded by the first limit aperture substrate 206, so that the passage of the electron beam is limited. On the other hand, electron beams not deflected by the blanker of the blanking aperture array mechanism 204 pass through the center hole of the first limit aperture substrate 206 as shown in FIG. 1. By ON/OFF of the individual blanking mechanism 47, blanking control is performed and ON/OFF of the beam is controlled. As described above, the first limit aperture substrate 206 shields each beam deflected to become a beam OFF state by the individual blanking control mechanism. In addition, a beam of one shot is formed by the beam having passed through the first limit aperture substrate 206, formed from beam ON to beam OFF, for each beam. The target object 101 is irradiated with the multiple photoelectron beams 20 controlled to be beam ON by the electron optical system. Specifically, the multiple photoelectron beams 20 having passed through the first limit aperture substrate 206 are focused by the electromagnetic lens 207 (objective lens) to become a pattern image of a desired reduction ratio, the entire multiple photoelectron beams 20 controlled to be beam ON are collectively deflected in the same direction by the objective deflector 208, and the respective irradiation positions of the beams on the target object 101 are irradiated with the beams. The multiple photoelectron beams 20 to be irradiated at one time are ideally arranged at a pitch obtained by multiplying the arrangement pitch of the plurality of holes 22 of the shaping aperture array substrate 203 by the desired reduction ratio described above.

Figure 4A:
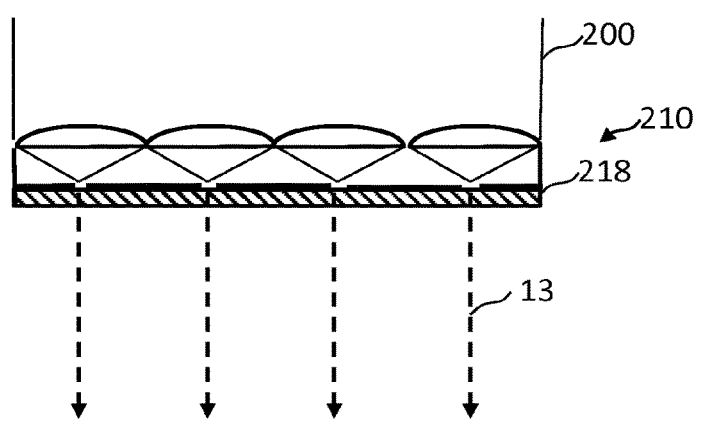
FIGS. 4A and 4B are diagrams illustrating transmitted light in the first embodiment.
Figure 4B:
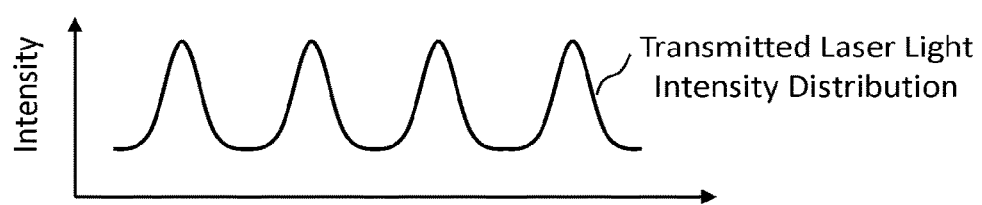

FIGS. 4A and 4B are diagrams illustrating transmitted light in the first embodiment. As described above, the film thickness of the photoelectric surface 218 is very small, and as shown in FIG. 4A, a part of the emitted laser light passes through the photoelectric surface 218. In the example of FIG. 4A, a plurality of transmitted lights 13 that have passed through the photoelectric surface 218 are shown. Diffracted light is also added to each transmitted light 13. The plurality of transmitted lights 13 have an intensity distribution as shown in FIG. 4B. When it is assumed that the laser light 200 is output from the laser light source 201 at an output of 1000 mW, for example, the transmittance of the illumination optical system 202 is, for example, 30%, and the transmittance of the photoelectric surface 218 is, for example, 40%, the intensity of the transmitted light passing through the photoelectric surface 218 becomes 120 mW. When it is assumed that an aperture ratio of the multi-anode electrode 220 is, for example, 1% and an aperture ratio in a mechanism including the shaping aperture array substrate 203 and the blanking aperture array mechanism 204 is, for example, 1%, transmitted light having the intensity of 0.01 mW passes through the blanking aperture array mechanism 204. If 100% of the transmitted light having passed through the blanking aperture array mechanism 204 reaches the surface of the target object 101 and is absorbed by the resist, the intensity of 0.01 mW corresponds to 0.2 nA with an electron beam of 50 kV. As described above, there is a problem that the resist on the target object 101 is exposed to the transmitted light separately from the electron beam. If the resist on the target object 101 is exposed to light, this affects writing accuracy. Therefore, in the first embodiment, the intensity of the transmitted light reaching the XY stage 105 is reduced.

Figure 5:
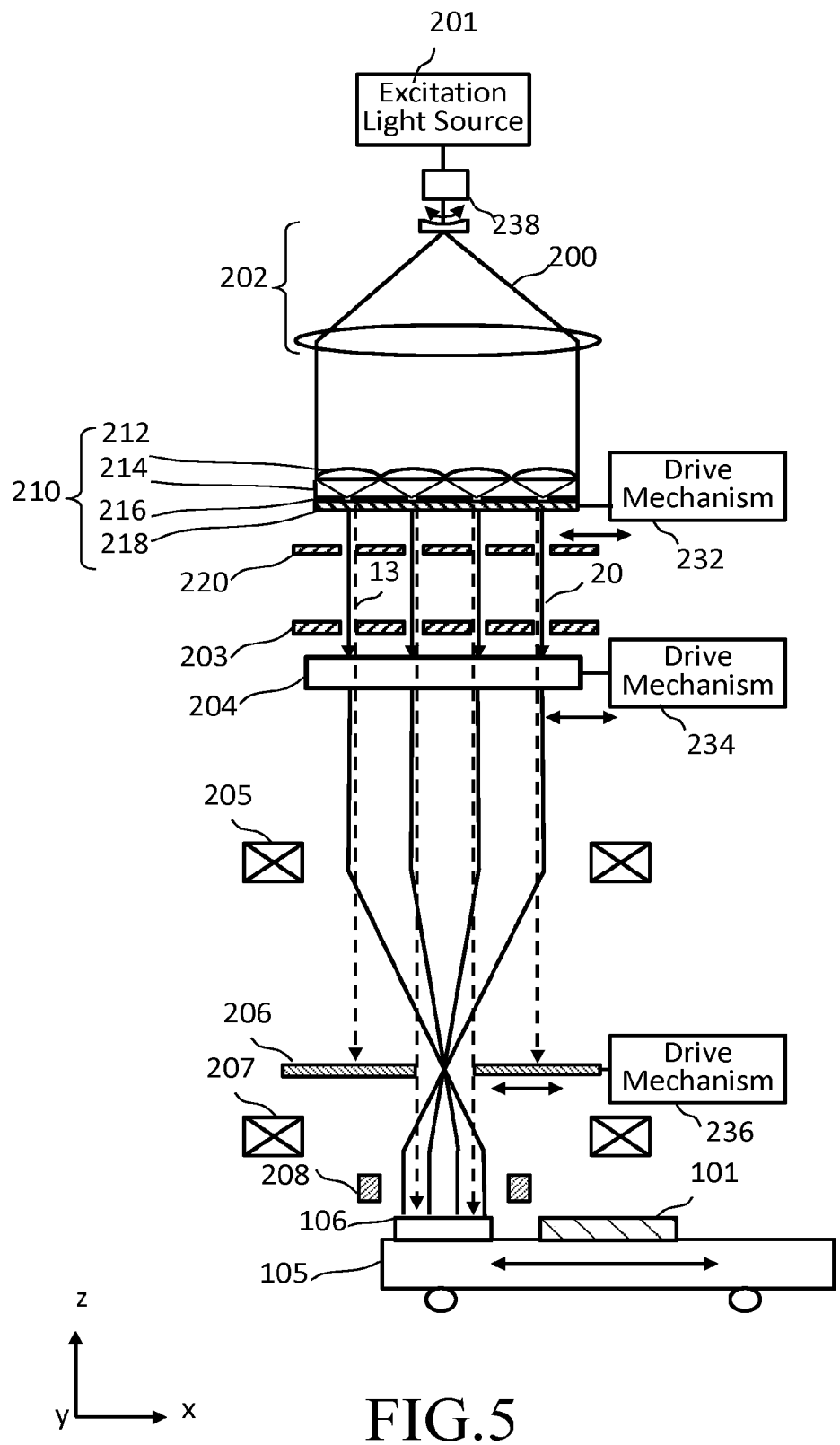
FIG. 5 is a diagram illustrating a method for adjusting the intensity of transmitted light in the first embodiment.

FIG. 5 is a diagram illustrating a method for adjusting intensity of transmitted light in the first embodiment. In the first embodiment, the adjustment of the laser light 200 illuminating the photoelectron emission mechanism 210, the adjustment of the position of the photoelectron emission mechanism 210, the adjustment of the position of the blanking aperture array mechanism 204, and/or the adjustment of the position of the first limit aperture substrate 206 are performed while the intensity of the transmitted light reaching the XY stage 105 is measured by the light intensity measuring device 106. In the first embodiment, for example, adjustment proceeds from the adjustment item on the upstream side.

Figure 6:
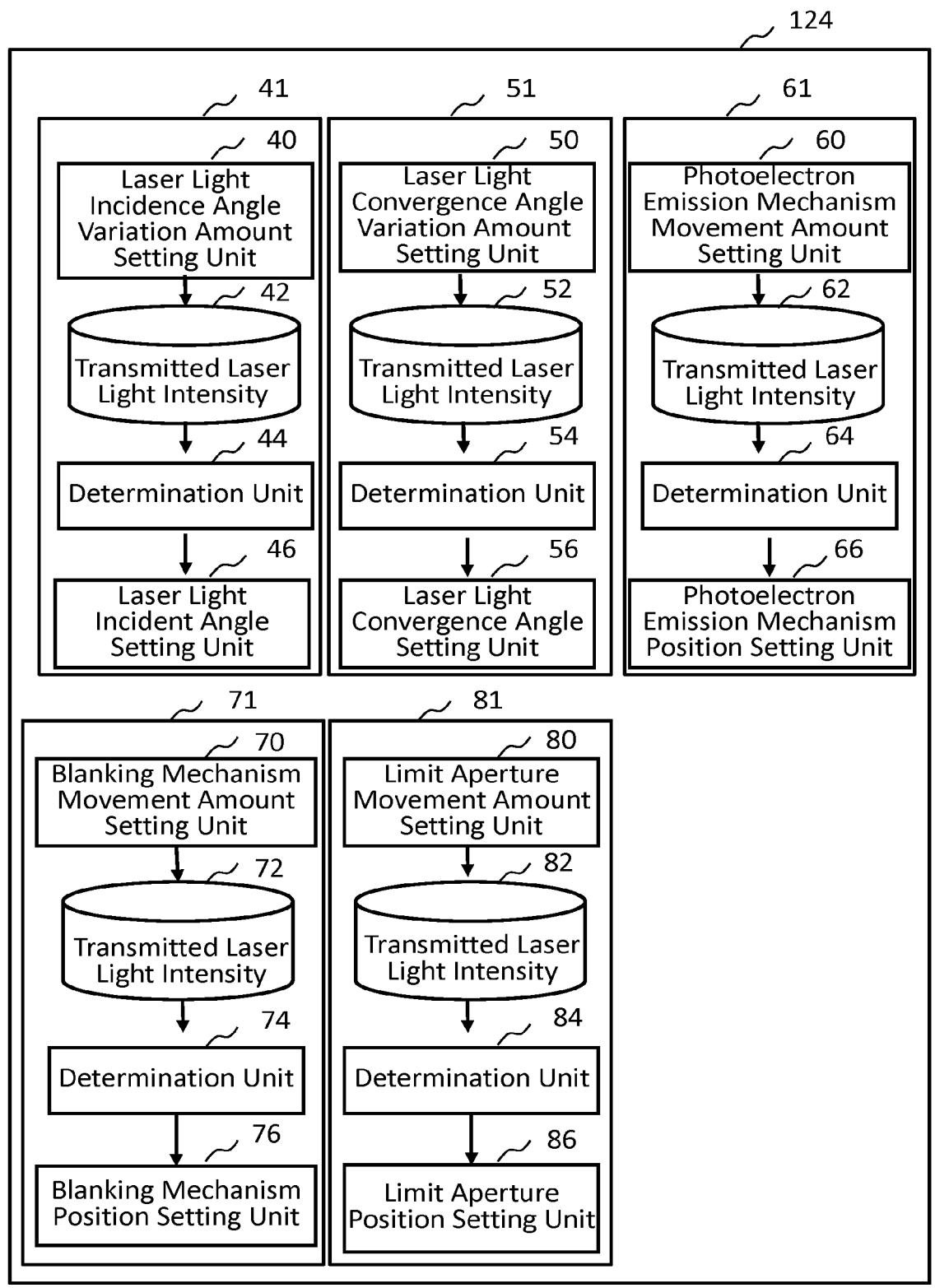
FIG. 6 is a block diagram showing an example of an internal configuration of an adjustment circuit in the first embodiment.

FIG. 6 is a block diagram showing an example of an internal configuration of an adjustment circuit in the first embodiment. In FIG. 6, a laser light incidence angle adjustment circuit 41, a laser light convergence angle adjustment circuit 51, a photoelectron emission mechanism position adjustment circuit 61, a blanking mechanism position adjustment circuit 71, and a limit aperture position adjustment circuit 81 are disposed in the adjustment circuit 124.

In the laser light incidence angle adjustment circuit 41, a storage device 42 such as a magnetic disk device, a laser light incidence angle variation amount setting unit 40, a determination unit 44, and a laser light incidence angle setting unit 46 are disposed.

In the laser light convergence angle adjustment circuit 51, a storage device 52 such as a magnetic disk device, a laser light convergence angle variation amount setting unit 50, a determination unit 54, and a laser light convergence angle setting unit 56 are disposed.

In the photoelectron emission mechanism position adjustment circuit 61, a storage device 62 such as a magnetic disk device, a photoelectron emission mechanism movement amount setting unit 60, a determination unit 64, and a photoelectron emission mechanism position setting unit 66 are disposed.

In the blanking mechanism position adjustment circuit 71, a storage device 72 such as a magnetic disk device, a blanking mechanism movement amount setting unit 70, a determination unit 74, and a blanking mechanism position setting unit 76 are disposed.

In the limit aperture position adjustment circuit 81, a storage device 82 such as a magnetic disk device, a limit aperture movement amount setting unit 80, a determination unit 84, and a limit aperture position setting unit 86 are disposed.

A series of "units" such as the laser light incidence angle variation amount setting unit 40, the determination unit 44, the laser light incidence angle setting unit 46, the laser light convergence angle variation amount setting unit 50, the determination unit 54, the laser light convergence angle setting unit 56, the photoelectron emission mechanism movement amount setting unit 60, the determination unit 64, the photoelectron emission mechanism position setting unit 66, the blanking mechanism movement amount setting unit 70, the determination unit 74, the blanking mechanism position setting unit 76, the limit aperture movement amount setting unit 80, the determination unit 84, and the limit aperture position setting unit 86 shown in FIG. 6 has a processing circuit. The processing circuit includes an electric circuit, a computer, a processor, a circuit board, a quantum circuit, or a semiconductor device. Further, a common processing circuit (same processing circuit) may be used for each unit. Alternatively, a different processing circuit (separate processing circuit) may be used. Input data necessary for the laser light incidence angle variation amount setting unit 40, the determination unit 44, the laser light incidence angle setting unit 46, the laser light convergence angle variation amount setting unit 50, the determination unit 54, the laser light convergence angle setting unit 56, the photoelectron emission mechanism movement amount setting unit 60, the determination unit 64, the photoelectron emission mechanism position setting unit 66, the blanking mechanism movement amount setting unit 70, the determination unit 74, the blanking mechanism position setting unit 76, the limit aperture movement amount setting unit 80, the determination unit 84, and the limit aperture position setting unit 86 or a result of calculation is stored in a memory (not shown) in the adjustment circuit 124 or the memory 111 each time.

Figure 7:
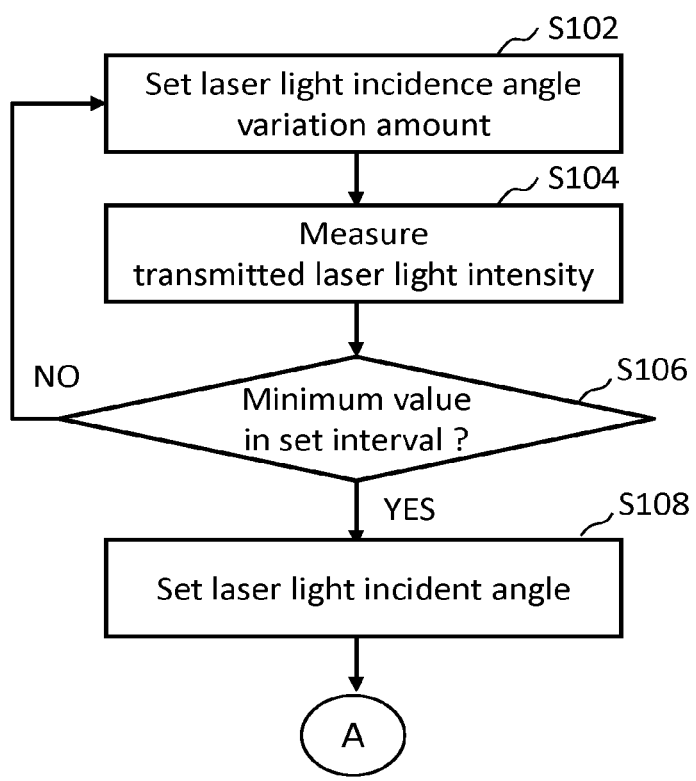
FIG. 7 is a flowchart showing a part of main steps of a writing method in the first embodiment.

FIG. 7 is a flowchart showing a part of main steps of a writing method in the first embodiment. In FIG. 7, the writing method according to the first embodiment performs a series of steps including a laser light incidence angle variation amount setting step (S102), a transmitted laser light intensity measurement step (S104), a determination step (S106), and a laser light incidence angle setting step (S108). FIG. 7 shows a step of adjusting a laser light incidence angle as one method for adjusting the transmitted laser light intensity.

As the laser light incidence angle variation amount setting step (S102), the laser light incidence angle variation amount setting unit 40 sets a variation amount of a laser light incidence angle on the illumination optical system 202 to the laser light adjustment mechanism 238, within a preset variation amount range. First, for example, 0° is set as an initial value of the laser light incidence angle.

As the transmitted laser light intensity measurement step (S104), first, the XY stage 105 is moved, and the light intensity measuring device 106 is moved into an irradiation region of the multiple photoelectron beams 20. Next, the laser light adjustment mechanism 238 receives the laser light 200 from the laser light source 201 and varies the laser light incidence angle on the illumination optical system 202 by the set variation amount.

The laser light adjustment mechanism 238 adjusts an incidence condition of the laser light incident on the photoelectron emission mechanism 210 (photoelectric surface). Specifically, the laser light adjustment mechanism 238 changes the laser light incidence angle or the laser light convergence angle. As the laser light adjustment mechanism 238, for example, one or more of a mirror or a lens controlled by a servo motor or a piezo element, a galvanometer mirror, a moire lens, a variable focus lens, and a liquid lens can be used.

Figure 8:
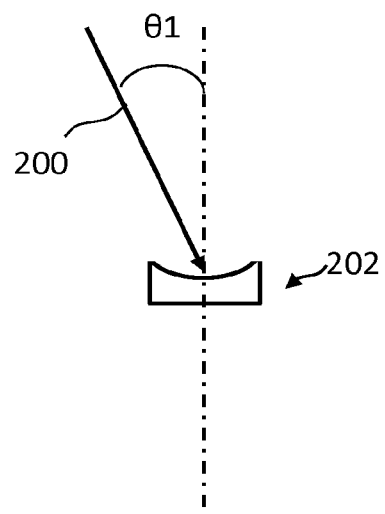
FIG. 8 is a diagram illustrating a laser light incidence angle in the first embodiment.

FIG. 8 is a diagram illustrating a laser light incidence angle in the first embodiment. As shown in FIG. 8, the laser light adjustment mechanism 238 adjusts a laser light incidence angle $\theta 1$ on the illumination optical system 202. By changing the incidence condition (here, the incidence angle) of each light incident on the photoelectric surface 218 and changing the orbit of the transmitted light transmitted through the photoelectric surface 218, the intensity of the transmitted light reaching the XY stage 105 can be changed.

The laser light incidence angle is varied, and for each varied incidence angle, as shown in FIG. 5, the intensity of the transmitted light 13 that is transmitted through the photoelectron emission mechanism 210 (photoelectric surface 218), passes through the blanking aperture array mechanism 204 and the first limit aperture substrate 206, and reaches the XY stage 105 is measured by the light intensity measuring device 106. The measured intensity of the transmitted light 13 is converted into a digital signal by the measurement circuit 126 and output to the adjustment circuit 124. Intensity data of the transmitted light 13 input to the adjustment circuit 124 is temporarily stored in the storage device 42.

As the determination step (S106), the determination unit 44 determines whether or not the measured intensity of the transmitted light 13 takes a minimum value within a preset variation range. When the minimum value is taken, the process proceeds to the laser light incidence angle setting step (S108). When the minimum value is not taken, the process returns to the laser light incidence angle variation amount setting step (S102), and each step from the laser light incidence angle variation amount setting step (S102) to the determination step (S106) is repeated while the laser light incidence angle is changed until it is determined that the minimum value is taken. For example, in the first and second measurements, since it is not possible to determine whether or not the minimum value is taken, each step is repeated as described above. In a case where the intensity of the transmitted light decreases as the laser light incidence angle is varied, normally, the intensity of the transmitted light decreases sequentially, and after shifting to an increase tendency, the intensity decreases again, which is considered to be due to an error caused by noise. Therefore, the determination unit 44 may determine the minimum value at a point of time when the intensity of the transmitted light sequentially decreases within the preset variation range and shifts to an increase tendency beyond a noise component. However, since a possibility of taking a plurality of minimal values within the preset variation range is not necessarily zero, an adjustment time increases, but it is better to determine the minimal value after completely performing the intensity measurement of the transmitted light within the preset variation range.

As the laser light incidence angle setting step (S108), the laser light incidence angle setting unit 46 sets the laser light incidence angle at which the intensity of the transmitted light 13 takes the minimum value within the preset variation range to the laser light adjustment mechanism 238, and adjusts the incidence angle of the laser light 200 to an incidence angle at which the intensity of the transmitted light 13 becomes smaller than an initial value, for example, an incidence angle at which the intensity of the transmitted light takes the minimum value.

Figure 9:
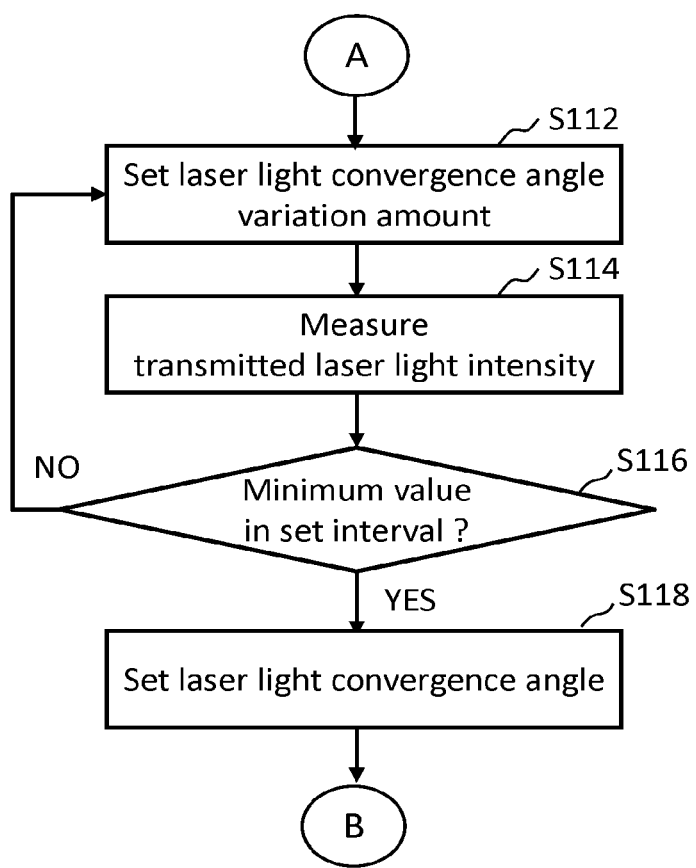
FIG. 9 is a flowchart showing another part of the main steps of the writing method in the first embodiment.

FIG. 9 is a flowchart showing another part of the main steps of the writing method in the first embodiment. In FIG. 9, the writing method according to the first embodiment performs a series of steps including a laser light convergence angle variation amount setting step (S112), a transmitted laser light intensity measurement step (S114), a determination step (S116), and a laser light convergence angle setting step (S118) subsequent to the steps of FIG. 7. FIG. 9 shows a step of adjusting a laser light convergence angle as one method for adjusting the transmitted laser light intensity.

As the laser light convergence angle variation amount setting step (S112), the laser light convergence angle variation amount setting unit 50 sets a variation amount of a laser light convergence angle on the illumination optical system 202 to the laser light adjustment mechanism 238, within a preset variation amount range. First, for example, 0° is set as an initial value of the laser light convergence angle.

As the transmitted laser light intensity measurement step (S114), the laser light adjustment mechanism 238 receives the laser light 200 from the laser light source 201 and varies the laser light convergence angle on the illumination optical system 202 by the set variation amount.

Figure 10:
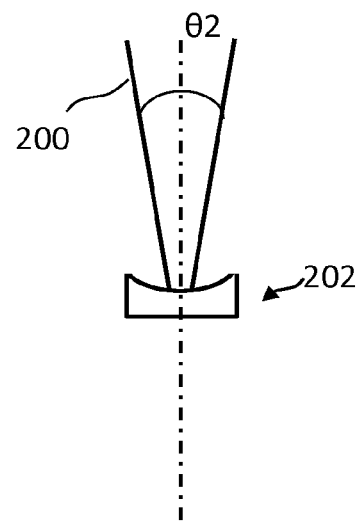
FIG. 10 is a diagram illustrating a laser light convergence angle in the first embodiment.

FIG. 10 is a diagram illustrating a laser light convergence angle in the first embodiment. As shown in FIG. 10, the laser light adjustment mechanism 238 variably adjusts a laser light convergence angle θ2 on the illumination optical system 202. By changing the incidence condition (here, the convergence angle) of each light incident on the photoelectric surface 218 and changing the orbit of the transmitted light transmitted through the photoelectric surface 218, the intensity of the transmitted light reaching the XY stage 105 can be changed.

The laser light convergence angle is varied, and for each varied convergence angle, as shown in FIG. 5, the intensity of the transmitted light 13 that is transmitted through the photoelectron emission mechanism 210 (photoelectric surface 218), passes through the blanking aperture array mechanism 204 and the first limit aperture substrate 206, and reaches the XY stage 105 is measured by the light intensity measuring device 106. The measured intensity of the transmitted light 13 is converted into a digital signal by the measurement circuit 126 and output to the adjustment circuit 124. Intensity data of the transmitted light 13 input to the adjustment circuit 124 is temporarily stored in the storage device 52.

As the determination step (S116), the determination unit 54 determines whether or not the measured intensity of the transmitted light 13 takes a minimum value within a preset variation range. When the minimum value is taken, the process proceeds to the laser light convergence angle setting step (S118). When the minimum value is not taken, the process returns to the laser light convergence angle variation amount setting step (S112), and each step from the laser light convergence angle variation amount setting step (S112) to the determination step (S116) is repeated while the laser light convergence angle is changed until it is determined that the minimum value is taken. As described above, for example, in the first and second measurements, since it is not possible to determine whether or not the minimum value is taken, each step is repeated as described above. In a case where the intensity of the transmitted light decreases as the laser light convergence angle is varied, normally, the intensity of the transmitted light decreases sequentially, and after shifting to an increase tendency, the intensity decreases again, which is considered to be due to an error caused by noise. Therefore, the determination unit 54 may determine the minimum value at a point of time when the intensity of the transmitted light sequentially decreases within the preset variation range and shifts to an increase tendency beyond a noise component. However, since a possibility of taking a plurality of minimal values within the preset variation range is not necessarily zero, an adjustment time increases, but it is better to determine the minimal value after completely performing the intensity measurement of the transmitted light within the preset variation range.

As the laser light convergence angle setting step (S118), the laser light convergence angle setting unit 56 sets the laser light convergence angle at which the intensity of the transmitted light 13 takes the minimum value within the preset variation range to the laser light adjustment mechanism 238, and adjusts the convergence angle of the laser light 200 to a convergence angle at which the intensity of the transmitted light 13 becomes smaller than an initial value, for example, a convergence angle at which the intensity of the transmitted light takes the minimum value.

Figure 11:
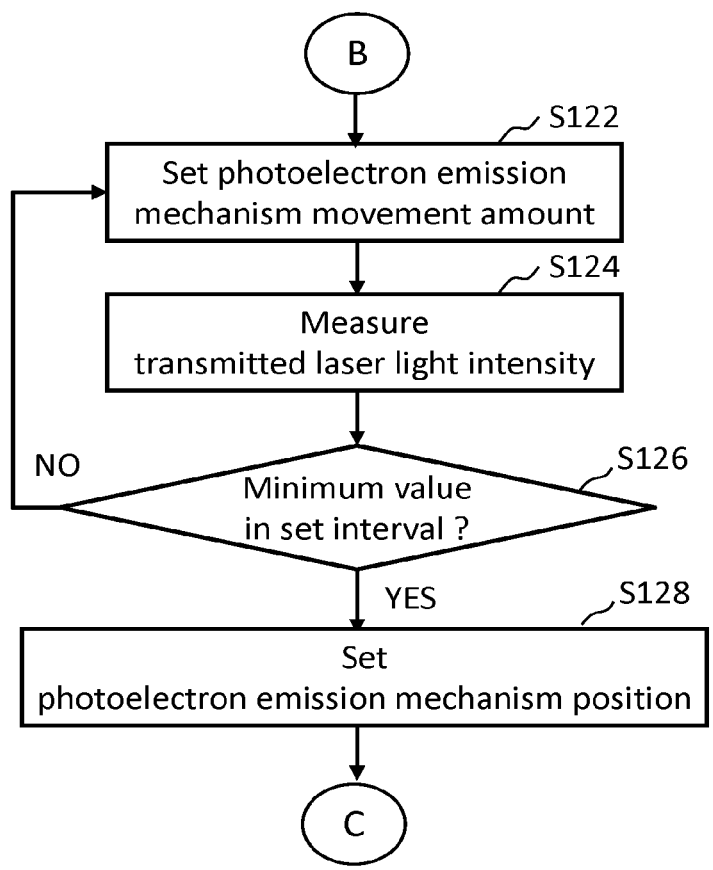
FIG. 11 is a flowchart showing another part of the main steps of the writing method in the first embodiment.

FIG. 11 is a flowchart showing another part of the main steps of the writing method in the first embodiment. In FIG. 11, the writing method according to the first embodiment performs a series of steps including a photoelectron emission mechanism (photoelectric surface) movement amount setting step (S122), a transmitted laser light intensity measurement step (S124), a determination step (S126), and a photoelectron emission mechanism position setting step (S128) subsequent to the steps of FIG. 9. FIG. 11 shows a step of adjusting a position of the photoelectron emission mechanism 210 as one method for adjusting the transmitted laser light intensity.

As the photoelectron emission mechanism movement amount setting step (S122), the photoelectron emission mechanism movement amount setting unit 60 sets a movement amount for moving the photoelectron emission mechanism 210 to the drive mechanism 232, within a preset movement amount range. First, for example, x, y=0 is set as an initial position of the photoelectron emission mechanism (photoelectric surface) 210.

As the transmitted laser light intensity measurement step (S124), the drive mechanism 232 moves the photoelectron emission mechanism 210 by the set movement amount. The drive mechanism 232 can move the photoelectron emission mechanism 210 in a two-dimensional direction (x and y directions) orthogonal to the orbit central axis (z direction) of the electron beam. Here, the case of moving the photoelectron emission mechanism 210 in the two-dimensional direction is described, but the photoelectron emission mechanism 210 may be moved only in a one-dimensional direction.

As shown in FIG. 5, by moving the photoelectron emission mechanism (photoelectric surface) 210, which is the arrangement object, in the x and y directions, the emission position of each transmitted light 13 can be shifted, and the orbit of the transmitted light can be varied. As a result, the intensity of the transmitted light reaching the XY stage 105 can be changed.

The photoelectron emission mechanism 210 is moved, and for each movement, as shown in FIG. 5, the intensity of the transmitted light 13 transmitted through the photoelectron emission mechanism 210 (photoelectric surface 218), the blanking aperture array mechanism 204, and the first limit aperture substrate 206 to be the arrangement objects and reaching the XY stage 105 is measured by the light intensity measuring device 106. The measured intensity of the transmitted light 13 is converted into a digital signal by the measurement circuit 126 and output to the adjustment circuit 124. Intensity data of the transmitted light 13 input to the adjustment circuit 124 is temporarily stored in the storage device 62.

As the determination step (S126), the determination unit 64 determines whether or not the measured intensity of the transmitted light 13 takes a minimum value within a preset movement range. When the minimum value is taken, the process proceeds to the photoelectron emission mechanism position setting step (S128). When the minimum value is not taken, the process returns to the photoelectron emission mechanism movement amount setting step (S122), and each step from the photoelectron emission mechanism movement amount setting step (S122) to the determination step (S126) is repeated while the position of the photoelectron emission mechanism is changed until it is determined that the minimum value is taken. As described above, for example, in the first and second measurements, since it is not possible to determine whether or not the minimum value is taken, each step is repeated as described above. In a case where the intensity of the transmitted light decreases as the position of the photoelectron emission mechanism 210 is moved, normally, the intensity of the transmitted light decreases sequentially, and after shifting to an increase tendency, the intensity decreases again, which is considered to be due to an error caused by noise. Therefore, the determination unit 64 may determine the minimum value at a point of time when the intensity of the transmitted light sequentially decreases within the preset variation range and shifts to an increase tendency beyond a noise component. However, since a possibility of taking a plurality of minimal values within the preset variation range is not necessarily zero, an adjustment time increases, but it is better to determine the minimal value after completely performing the intensity measurement of the transmitted light within the preset variation range.

As the photoelectron emission mechanism position setting step (S128), the photoelectron emission mechanism position setting unit 66 sets the position of the photoelectron emission mechanism 210 where the intensity of the transmitted light 13 takes the minimum value within the preset movement amount range to the drive mechanism 232, and adjusts the position of the photoelectron emission mechanism 210 to a position where the intensity of the transmitted light 13 is smaller than an initial value, for example, a position where the intensity takes the minimum value.

Figure 12:
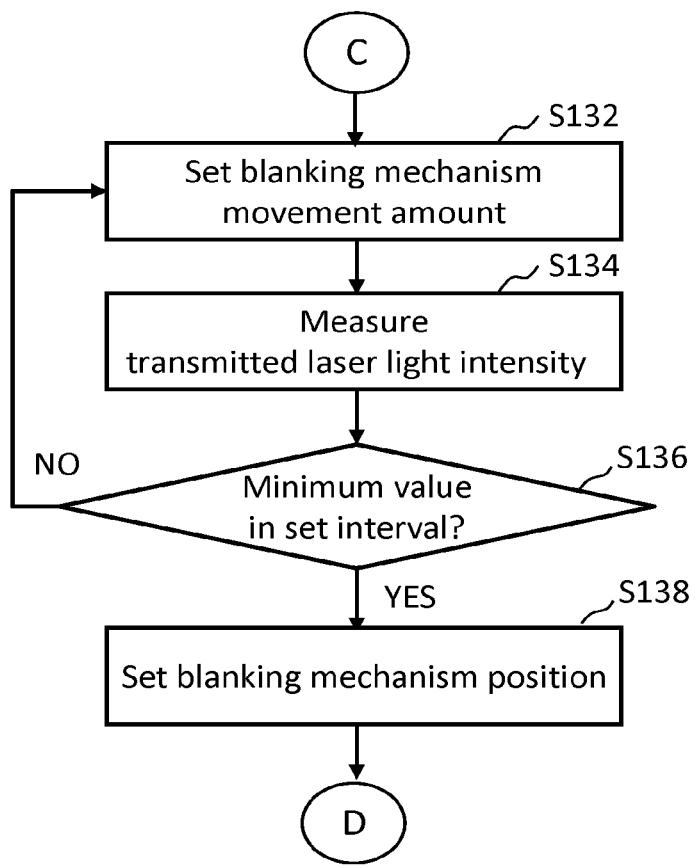
FIG. 12 is a flowchart showing another part of the main steps of the writing method in the first embodiment.

FIG. 12 is a flowchart showing another part of the main steps of the writing method in the first embodiment. In FIG. 12, the writing method according to the first embodiment performs a series of steps including a blanking mechanism movement amount setting step (S132), a transmitted laser light intensity measurement step (S134), a determination step (S136), and a blanking mechanism position setting step (S138) subsequent to the steps of FIG. 11. FIG. 12 illustrates a step of adjusting the position of the blanking aperture array mechanism 204 as one method for adjusting the transmitted laser light intensity. Each aperture of the blanking aperture array mechanism 204 to be an arrangement object allows the electron beam to pass therethrough and allows a part of the transmitted light to pass therethrough. On the other hand, a part of the transmitted light is shielded in a region other than the aperture. Therefore, the transmitted laser light intensity can be adjusted by adjusting (the aperture position of) the blanking aperture array mechanism 204.

As the blanking mechanism movement amount setting step (S132), the blanking mechanism movement amount setting unit 70 sets a movement amount by which the blanking aperture array mechanism 204 is moved to the drive mechanism 234 within the preset movement amount range. First, for example, x, y=0 is set as an initial position of the blanking aperture array mechanism 204.

As the transmitted laser light intensity measurement step (S134), the drive mechanism 234 moves the blanking aperture array mechanism 204 by the set movement amount. The drive mechanism 234 can move the blanking aperture array mechanism 204 in a two-dimensional direction (x and y directions) orthogonal to the orbit central axis (z direction) of the electron beam. Here, the case of moving the photoelectron emission mechanism 210 in the two-dimensional direction is described, but the photoelectron emission mechanism 210 may be moved only in a one-dimensional direction.

As shown in FIG. 5, by moving the blanking aperture array mechanism 204 in the x and y directions, the position of the passage hole 25 through which each transmitted light 13 can pass can be shifted. As a result, the intensity of the transmitted light reaching the XY stage 105 can be changed.

The blanking aperture array mechanism 204 is moved, and for each movement, as shown in FIG. 5, the intensity of the transmitted light 13 transmitted through the photoelectron emission mechanism 210 (photoelectric surface 218), the blanking aperture array mechanism 204, and the first limit aperture substrate 206 to be the arrangement objects and reaching the XY stage 105 is measured by the light intensity measuring device 106. The measured intensity of the transmitted light 13 is converted into a digital signal by the measurement circuit 126 and output to the adjustment circuit 124. Intensity data of the transmitted light 13 input to the adjustment circuit 124 is temporarily stored in the storage device 72.

As the determination step (S136), the determination unit 74 determines whether or not the measured intensity of the transmitted light 13 takes a minimum value within a preset movement range. When the minimum value is taken, the process proceeds to the blanking mechanism position setting step (S138). When the minimum value is not taken, the process returns to the blanking mechanism movement amount setting step (S132), and each step from the blanking mechanism movement amount setting step (S132) to the determination step (S136) is repeated while the position of the blanking mechanism is changed until it is determined that the minimum value is taken. As described above, for example, in the first and second measurements, since it is not possible to determine whether or not the minimum value is taken, each step is repeated as described above. In a case where the intensity of the transmitted light decreases as the position of the blanking aperture array mechanism 204 is moved, normally, the intensity of the transmitted light decreases sequentially, and after shifting to an increase tendency, the intensity decreases again, which is considered to be due to an error caused by noise. Therefore, the determination unit 74 may determine the minimum value at a point of time when the intensity of the transmitted light sequentially decreases within the preset variation range and shifts to an increase tendency beyond a noise component. However, since a possibility of taking a plurality of minimal values within the preset variation range is not necessarily zero, an adjustment time increases, but it is better to determine the minimal value after completely performing the intensity measurement of the transmitted light within the preset variation range.

As the blanking mechanism position setting step (S138), the blanking mechanism position setting unit 76 sets the position of the blanking mechanism where the intensity of the transmitted light 13 takes the minimum value within the preset movement amount range to the drive mechanism 234, and adjusts the position of the blanking aperture array mechanism 204 to a position where the intensity of the transmitted light 13 becomes smaller than an initial value, for example, a position where the intensity takes the minimum value.

Figure 13:
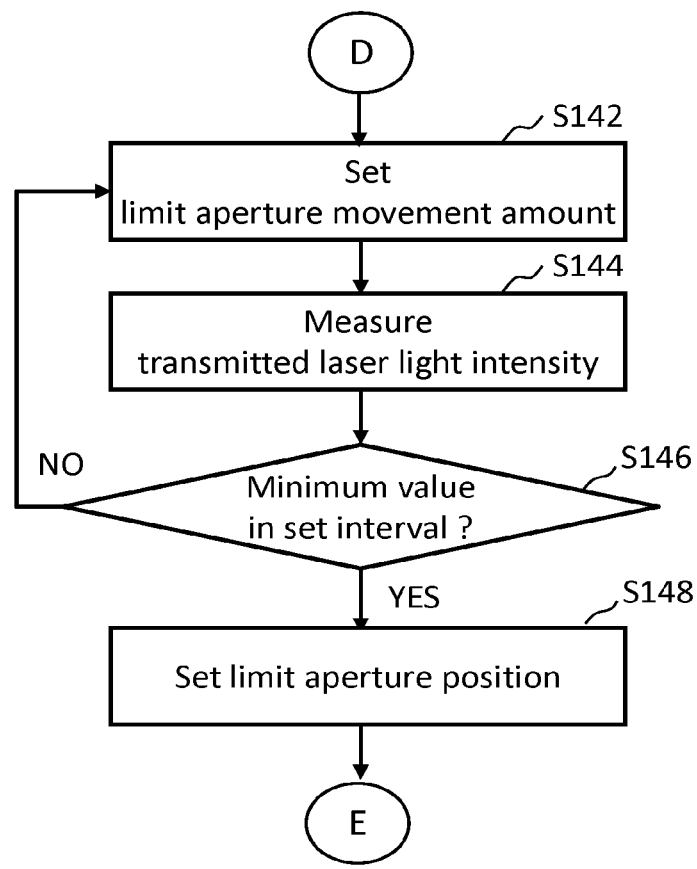
FIG. 13 is a flowchart showing another part of the main steps of the writing method in the first embodiment.

FIG. 13 is a flowchart showing another part of the main steps of the writing method in the first embodiment. In FIG. 13, the writing method according to the first embodiment performs a series of steps including a limit aperture movement amount setting step (S142), a transmitted laser light intensity measurement step (S144), a determination step (S146), and a limit aperture position setting step (S148) subsequent to the steps of FIG. 12. FIG. 13 illustrates a step of adjusting the position of the first limit aperture substrate 206 as one method for adjusting the transmitted laser light intensity. The aperture of the first limit aperture substrate 206, which is an arrangement object, allows the electron beam to pass therethrough and allows a part of the transmitted light to pass therethrough. On the other hand, a part of the transmitted light is shielded in a region other than the aperture. Therefore, the transmitted laser light intensity can be adjusted by adjusting (the aperture position of) the first limit aperture substrate 206.

As the limit aperture movement amount setting step (S142), the limit aperture movement amount setting unit 80 sets a movement amount by which the first limit aperture substrate 206 is moved to the drive mechanism 236, within a preset movement amount range. First, for example, x, y=0 is set as an initial position of the first limit aperture substrate 206.

As the transmitted laser light intensity measurement step (S144), the drive mechanism 236 moves the first limit aperture substrate 206 by the set movement amount. The drive mechanism 236 can move the first limit aperture substrate 206 in a two-dimensional direction (x and y directions) orthogonal to the orbit central axis (z direction) of the electron beam. Here, the case of moving the photoelectron emission mechanism 210 in the two-dimensional direction is described, but the photoelectron emission mechanism 210 may be moved only in a one-dimensional direction.

As shown in FIG. 5, by moving the first limit aperture substrate 206 in the x and y directions, the position of the opening through which each transmitted light 13 can pass can be shifted. As a result, the intensity of the transmitted light reaching the XY stage 105 can be changed.

The first limit aperture substrate 206 is moved, and for each movement, as shown in FIG. 5, the intensity of the transmitted light 13 transmitted through the photoelectron emission mechanism 210 (photoelectric surface 218), the blanking aperture array mechanism 204, and the first limit aperture substrate 206 to be the arrangement objects and reaching the XY stage 105 is measured by the light intensity measuring device 106. The measured intensity of the transmitted light 13 is converted into a digital signal by the measurement circuit 126 and output to the adjustment circuit 124. Intensity data of the transmitted light 13 input to the adjustment circuit 124 is temporarily stored in the storage device 82.

As the determination step (S146), the determination unit 84 determines whether or not the measured intensity of the transmitted light 13 takes a minimum value within a preset movement range. When the minimum value is taken, the process proceeds to the limit aperture position setting step (S148). When the minimum value is not taken, the process returns to the limit aperture movement amount setting step (S142), and each step from the limit aperture movement amount setting step (S142) to the determination step (S146) is repeated while the position of the limit aperture is changed until it is determined that the minimum value is taken. As described above, for example, in the first and second measurements, since it is not possible to determine whether or not the minimum value is taken, each step is repeated as described above. In a case where the intensity of the transmitted light decreases as the position of the first limit aperture substrate 206 is moved, normally, the intensity of the transmitted light decreases sequentially, and after shifting to an increase tendency, the intensity decreases again, which is considered to be due to an error caused by noise. Therefore, the determination unit 84 may determine the minimum value at a point of time when the intensity of the transmitted light sequentially decreases within the preset variation range and shifts to an increase tendency beyond a noise component. However, since a possibility of taking a plurality of minimal values within the preset variation range is not necessarily zero, an adjustment time increases, but it is better to determine the minimal value after completely performing the intensity measurement of the transmitted light within the preset variation range.

As the limit aperture substrate position setting step (S148), the limit aperture position setting unit 86 sets the position of the limit aperture substrate where the intensity of the transmitted light 13 takes the minimum value within the preset movement amount range to the drive mechanism 236, and adjusts the position of the first limit aperture substrate 206 to a position where the intensity of the transmitted light 13 becomes smaller than an initial value, for example, a position where the intensity takes the minimum value.

Figure 14:
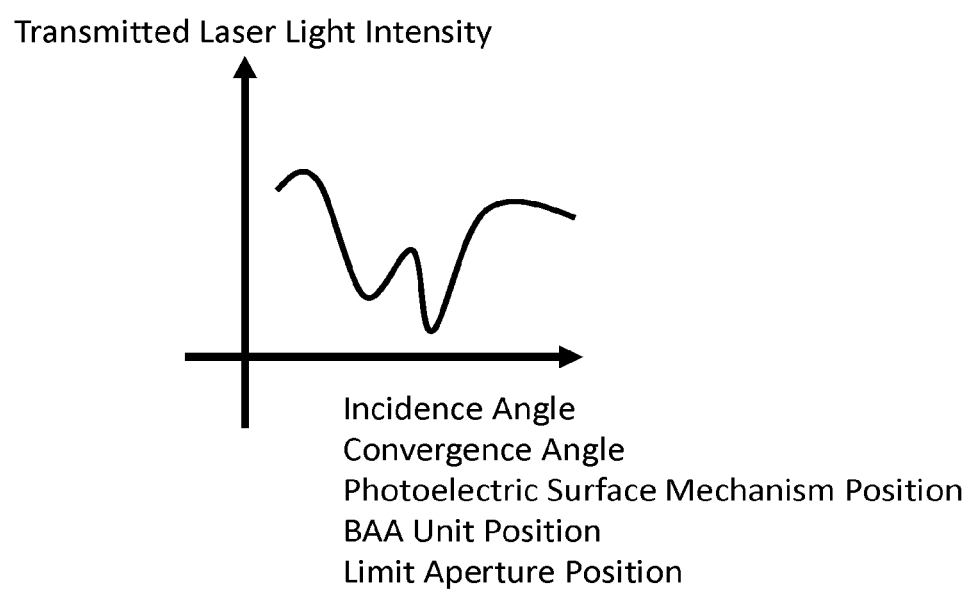
FIG. 14 is a diagram illustrating a relation between transmitted laser light intensity and each adjustment item in the first embodiment.

FIG. 14 is a diagram illustrating a relation between transmitted laser light intensity and each adjustment item in the first embodiment. In FIG. 14, a vertical axis represents the transmitted laser light intensity (the intensity of the transmitted light 13), and a horizontal axis represents an incidence angle, a convergence angle, a photoelectric surface mechanism (photoelectron emitter) position, a blanking aperture array mechanism (BAA unit) position, or a limit aperture position as each adjustment item. By adjusting each adjustment item, the intensity of the transmitted light 13 reaching the XY stage 105 varies for each adjustment item. In the example of FIG. 14, although a case where two minimum values are generated is shown, in this case, it is preferable to adjust each adjustment item under a condition to take a smaller minimum value.

As described above, a value of the adjustment item is adjusted such that the intensity of the transmitted light 13 reaching the XY stage 105 becomes smaller than an initial value, for example. As a result, when the surface of the target object 101 is irradiated with the multiple photoelectron beams 20, the transmitted light 13 reaching the surface of the target object 101 can be suppressed or reduced. Therefore, the exposure of the resist coated on the target object 101 can be suppressed or reduced.

Figure 15:
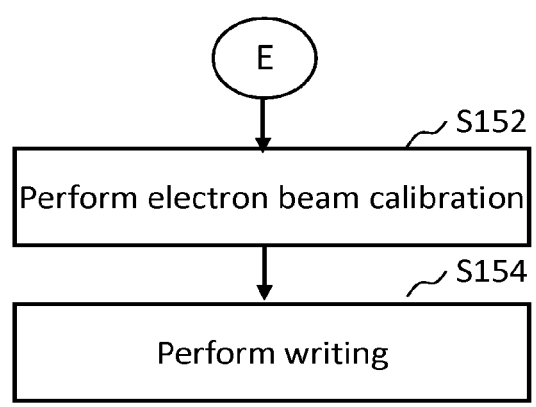
FIG. 15 is a flowchart showing a remainder of the main steps of the writing method in the first embodiment.

FIG. 15 is a flowchart showing a remainder of the main steps of the writing method in the first embodiment. In FIG. 15, the writing method according to the first embodiment performs a series of steps including an electron beam calibration step (S152) and a writing step (S154) subsequent to the steps of FIG. 13.

As the electron beam calibration step (S152), first, the XY stage 105 is moved so that the Faraday cup 107 is located in the irradiation region of the multiple photoelectron beams 20. Then, a current amount of the multiple photoelectron beams 20 is measured by the Faraday cup 107. Then, calibration is performed so that the current amount of the multiple photoelectron beams 20 satisfies a desired value. For example, 512×512 multiple photoelectron beams 20 are grouped into a predetermined number (for example, 64×64) of beams, and the current amount is measured by the Faraday cup 107 for each group to confirm whether or not a threshold range is satisfied. In a case where the threshold range is not satisfied, the intensity of the laser light 200 generated from the laser light source 201 is adjusted so that the threshold range is satisfied. Alternatively, the position of the blanking aperture array mechanism 204 and/or the first limit aperture substrate 206 is adjusted. Since the intensity of the transmitted light 13 varies when the position of the blanking aperture array mechanism 204 or/and the first limit aperture substrate 206 is adjusted, the intensity of the transmitted light 13 may be adjusted again. The intensity of the transmitted light 13 is adjusted within a range in which the multiple photoelectron beams 20 satisfy the threshold range.

As the writing step (S154), the writing mechanism 150 irradiates the target object 101 with the multiple photoelectron beams 20 (electron beams) under the condition that the intensity of the transmitted light 13 is adjusted to be smaller than the initial value. As a result, a desired pattern is written on the target object 101.

As described above, according to the first embodiment, it is possible to reduce the arrival of the transmitted light 13 on the surface of the target object 101 in the electron beam irradiation. Therefore, for example, resist exposure by the transmitted light 13 can be suppressed, a positional deviation and a dimensional deviation of a pattern to be written can be reduced, and writing accuracy can be improved.

Second Embodiment

In a second embodiment, a configuration for reducing transmitted light 13 on the upstream side of a blanking aperture array mechanism 204 will be described. Points not specifically described below may be the same as those of the first embodiment.

Figure 16:
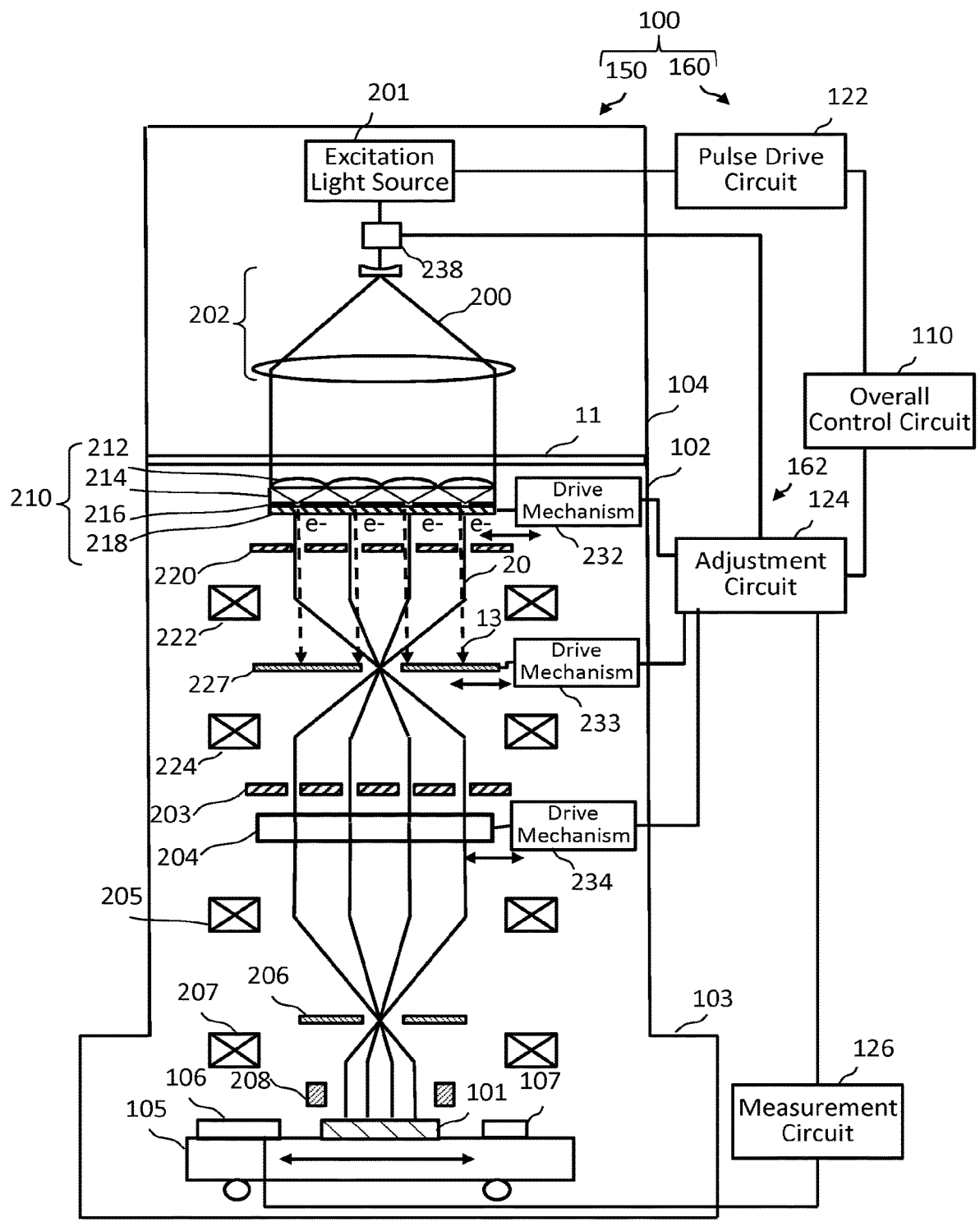
FIG. 16 is a conceptual diagram showing a configuration of a writing apparatus in a second embodiment.

FIG. 16 is a conceptual diagram showing a configuration of a writing apparatus in the second embodiment. FIG. 16 is the same as FIG. 1 except that an electromagnetic lens 222, a second limit aperture substrate 227, and an electromagnetic lens 224 are disposed between a multi-anode electrode 220 and a shaping aperture array substrate 203, and a drive mechanism (drive circuit) 233 that drives the second limit aperture substrate 227 is further disposed instead of a drive circuit 236. Note that the drive mechanism 236 shown in FIG. 1 may be disposed.

The electromagnetic lens 222 and the electromagnetic lens 224 form a doublet lens. The electromagnetic lens 222 and the electromagnetic lens 224 are excited with opposite signs of an on-axis magnetic field and the same magnitude. Further, the second limit aperture substrate 227 is disposed at an intermediate height position of the electromagnetic lens 222 and the electromagnetic lens 224. Therefore, the second limit aperture substrate 227 is disposed between a photoelectric surface 218 and the blanking aperture array mechanism 204.

In the second embodiment, most of the transmitted light 13 transmitted through the photoelectric surface 218 can be shielded by the second limit aperture substrate 227 on the upstream side of the blanking aperture array mechanism 204. However, a part of the transmitted light 13 passes through an opening of the second limit aperture substrate 227. Therefore, in the second embodiment, the position of the second limit aperture substrate 227 is adjusted by the drive mechanism 233 under the control of an adjustment circuit 124 so as to reduce the intensity of the transmitted light 13 reaching an XY stage 105. An aperture of the second limit aperture substrate 227 to be an arrangement object allows an electron beam to pass therethrough and allows a part of the transmitted light to pass therethrough. On the other hand, a part of the transmitted light is shielded in a region other than the aperture. Therefore, the transmitted laser light intensity can be adjusted by adjusting (the aperture position of) the second limit aperture substrate 227. A method for adjusting the position of the second limit aperture substrate 227 is similar to that in the case of the first limit aperture substrate 206 described with reference to FIG. 13. In the second embodiment, similarly to the first embodiment, it is preferable to adjust each adjustment item from the upstream side. Therefore, in the second embodiment, it is preferable to adjust the position of the second limit aperture substrate 227 before adjusting the position of the blanking aperture array mechanism 204.

Therefore, in the second embodiment, the adjustment of laser light 200 illuminating a photoelectron emission mechanism 210, the adjustment of the position of the photoelectron emission mechanism 210, the adjustment of the position of the second limit aperture substrate 227, and/or the adjustment of the position of blanking aperture array mechanism 204 are performed while the intensity of the transmitted light reaching the XY stage 105 is measured by a light intensity measuring device 106. Each adjustment method is similar to that of the first embodiment.

In the second embodiment, since the intensity of the transmitted light 13 is reduced by adjusting the position of the second limit aperture substrate 227, adjustment to reduce the intensity of the transmitted light 13 by the adjustment of the position of the first limit aperture substrate 206 is omitted. However, it goes without saying that the position of the first limit aperture substrate 206 may be adjusted, similarly to the first embodiment.

The other contents may be similar to those in the first embodiment. According to the second embodiment, similarly to the first embodiment, it is possible to reduce the arrival of the transmitted light 13 on a surface of a target object 101 in the electron beam irradiation.

Third Embodiment

In a third embodiment, a configuration for reducing the intensity of transmitted light by shifting an orbit of multiple photoelectron beams 20 will be described.

Figure 17:
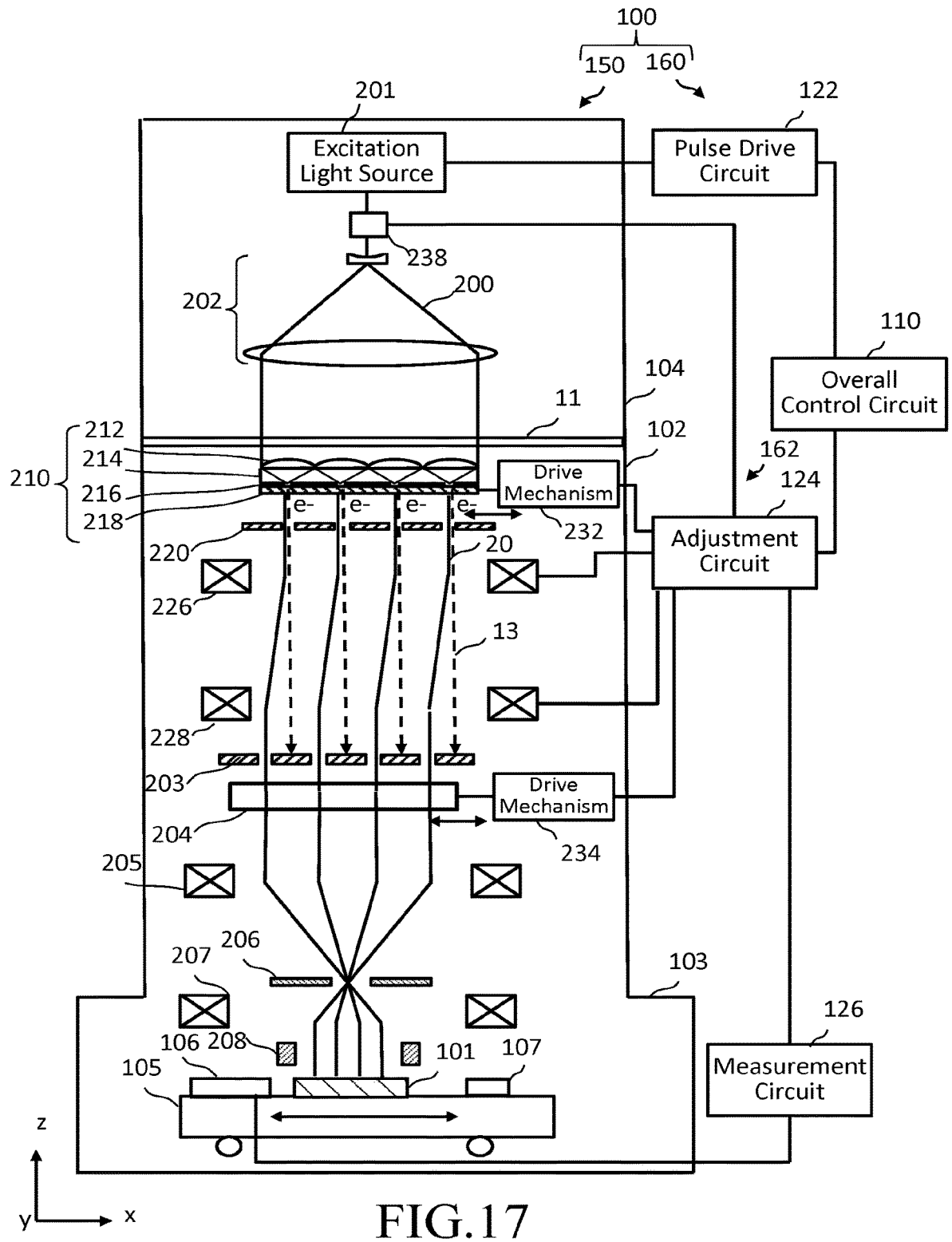
FIG. 17 is a conceptual diagram showing a configuration of a writing apparatus in a third embodiment.

FIG. 17 is a conceptual diagram showing a configuration of a writing apparatus in the third embodiment. FIG. 17 is the same as FIG. 1 except that alignment coils 226 and 228 are disposed between a multi-anode electrode 220 and a shaping aperture array substrate 203, positions of central axes of the shaping aperture array substrate 203, a blanking aperture array mechanism 204, an electromagnetic lens 205, a first limit aperture substrate 206, an electromagnetic lens 207 (objective lens), and an objective deflector 208 are shifted, and the arrangement of a drive mechanism (drive circuit) 236 is omitted. Note that the drive mechanism 236 shown in FIG. 1 may be disposed.

In the third embodiment, an adjustment mechanism adjusts an orbit of the plurality of electron beams. In the third embodiment, as shown in FIG. 17, after the central axis of the orbit is deflected obliquely downward at a predetermined angle by deflecting the multiple photoelectron beams 20 accelerated by the multi-anode electrode 220 by the alignment coil 226, the central axis of the orbit is restored by deflecting the central axis of the orbit at a predetermined angle of an opposite direction by the alignment coil 228. As a result, the position of the central axis of the orbit of the multiple photoelectron beams 20 can be shifted parallel to a z axis. The central axes of the first limit aperture substrate 206, the electromagnetic lens 207 (objective lens), and the objective deflector 208 are arranged to be matched with the central axis of the orbit of the multiple photoelectron beams 20 moved by the alignment coils 226 and 228.

As a result, a relative positional relation between each opening of the multi-anode electrode 220 and each hole 22 of the shaping aperture array substrate 203 can be changed. For this reason, each opening of the multi-anode electrode 220 and each hole 22 of the shaping aperture array substrate 203 are not on the same straight line. Therefore, when the transmitted light 13 having passed through each opening of the multi-anode electrode 220 is incident on the shaping aperture array substrate 203, the transmitted light 13 is misaligned from each hole 22. As a result, the misaligned transmitted light 13 can be shielded by the shaping aperture array substrate 203. In this way, in the present embodiment, the intensity of the transmitted light reaching the XY stage 105 can be changed by changing the orbit of the multiple photoelectron beams.

Therefore, most of the transmitted light 13 transmitted through a photoelectric surface 218 can be shielded by the shaping aperture array substrate 203 on the upstream side of the blanking aperture array mechanism 204. However, some transmitted light 13 passes through the shaping aperture array substrate 203 and travels to the blanking aperture array mechanism 204. Therefore, the intensity of the transmitted light having passed through the shaping aperture array substrate 203 is further reduced by adjusting the position of the blanking aperture array mechanism 204.

Therefore, in the third embodiment, the adjustment of laser light 200 illuminating a photoelectron emission mechanism 210, the adjustment of the position of the photoelectron emission mechanism 210, and/or the adjustment of the position of blanking aperture array mechanism 204 are performed while the intensity of the transmitted light reaching the XY stage 105 is measured by a light intensity measuring device 106. Each adjustment method is similar to that of the first embodiment.

In the third embodiment, since the intensity of the transmitted light 13 is reduced by the movement of the central axis of the orbit of the multiple photoelectron beams 20, the adjustment to reduce the intensity of the transmitted light 13 by the adjustment of the position of the first limit aperture substrate 206 is omitted. However, it goes without saying that the position of the first limit aperture substrate 206 may be adjusted, similarly to the first embodiment.

The other contents may be similar to those in the first embodiment. According to the third embodiment, similarly to the first embodiment, it is possible to reduce the arrival of the transmitted light 13 on a surface of a target object 101 in the electron beam irradiation.

The embodiments have been described with reference to the specific examples. However, the present invention is not limited to these specific examples. In these embodiments, an example in which the photoelectric surface, the blanking aperture array mechanism 204, the first limit aperture 206, and the second limit aperture 227 are adjusted has been described. However, the present invention is not limited thereto, and the intensity of the transmitted light 13 can be adjusted by adjusting the position of the arrangement object provided on the path of the transmitted light, such as the shaping aperture array substrate.

Further, descriptions of parts and the like that are not directly necessary for explanation of the present invention, such as the apparatus configuration and the control method, have been omitted. However, the necessary apparatus configuration and control method can be appropriately selected and used. For example, although the description of the control unit configuration for controlling the writing apparatus 100 is omitted, it goes without saying that the necessary control unit configuration is appropriately selected and used.

In addition, all electron beam irradiation apparatuses and electron beam irradiation methods including the elements of the present invention and capable of being appropriately designed and changed by those skilled in the art are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electron beam irradiation apparatus comprising:
a photoelectric surface configured to receive irradiation of excitation light on a side of a front surface, and generate a plurality of electron beams from a side of a back surface;
a blanking aperture array mechanism provided with passage holes corresponding to the plurality of electron beams and configured to perform deflection control on each of the plurality of electron beams passing through the passage holes;
a limit aperture substrate provided with an opening and configured to limit passage of the plurality of electron beams;
a stage on which a target object irradiated with the plurality of electron beams having passed through the blanking aperture array mechanism and the limit aperture substrate can be mounted; and
an adjustment mechanism configured to adjust at least one of an orbit of transmitted light that passes through at least one of arrangement objects including the photoelectric surface, the blanking aperture array mechanism, and the limit aperture substrate up to the stage and reaches the stage, among an irradiated excitation light, and an orbit of the plurality of electron beams, wherein
the arrangement objects shield at least a part of the transmitted light.

2. The apparatus according to claim 1, wherein the adjustment mechanism has an excitation light adjustment mechanism that adjusts an incidence condition of the excitation light incident on the photoelectric surface.

3. The apparatus according to claim 1, wherein the adjustment mechanism has at least one drive mechanism that moves at least one position of the arrangement objects.

4. The apparatus according to claim 1, wherein the adjustment mechanism moves a central axis of the orbit of the plurality of electron beams in parallel by deflecting the plurality of electron beams at a predetermined angle, and then deflecting the plurality of electron beams at the predetermined angle in an opposite direction.

5. The apparatus according to claim 1, wherein the adjustment mechanism has a drive mechanism that moves the photoelectric surface.

6. The apparatus according to claim 1, wherein the limit aperture substrate is disposed between the blanking aperture array mechanism and the stage.

7. The apparatus according to claim 1, wherein the limit aperture substrate is disposed between the photoelectric surface and the blanking aperture array mechanism.

8. An electron beam irradiation method comprising:
receiving irradiation of excitation light on a side of a front surface of a photoelectric surface and emitting a plurality of electron beams from a side of a back surface of the photoelectric surface;
adjusting at least one of an orbit of transmitted light of the irradiated excitation light that passes through at least one of arrangement objects including the photoelectric surface, a blanking aperture array mechanism performing deflection control on each of the plurality of electron beams, and a limit aperture substrate provided with an opening and limiting passage of the plurality of electron beams and reaches a stage on which a target object is mounted, and an orbit of the plurality of electron beams;
shielding at least a part of the transmitted light by the arrangement objects; and
irradiating the target object with the plurality of electron beams.

9. The method according to claim 8, wherein an incidence condition of the excitation light on the photoelectric surface is adjusted in the adjustment.

10. The method according to claim 8, further comprising:
moving at least one position of the arrangement objects.

11. The method according to claim 8, wherein the orbit of the plurality of electron beams is adjusted by moving a central axis of the orbit of the plurality of electron beams in parallel by deflecting the plurality of electron beams at a predetermined angle and then deflecting the plurality of electron beams at the predetermined angle in an opposite direction.

* * * * *